United States Patent [19]

Ahn

[11] Patent Number: 5,087,857
[45] Date of Patent: Feb. 11, 1992

[54] PLASMA GENERATING APPARATUS AND METHOD USING MODULATION SYSTEM

[75] Inventor: Tae-Hyuk Ahn, Suweon, Rep. of Korea

[73] Assignee: SamSung Electronics Co., Ltd., Suwon, Rep. of Korea

[21] Appl. No.: 560,756

[22] Filed: Jul. 31, 1990

[30] Foreign Application Priority Data

Jun. 18, 1990 [KR] Rep. of Korea ............... 8939/1990

[51] Int. Cl.$^5$ ............................................. H05H 1/24
[52] U.S. Cl. .......................... 315/111.21; 315/111.41; 313/231.31
[58] Field of Search ................ 315/111.21, 111.41, 315/111.81; 313/231.31

[56] References Cited

U.S. PATENT DOCUMENTS

| | | | |
|---|---|---|---|
| 4,818,916 | 4/1989 | Morrisroe | 315/111.21 |
| 4,829,215 | 5/1989 | Kim et al. | 315/111.41 |
| 4,911,814 | 3/1990 | Matsuoka et al. | 315/111.41 X |
| 4,947,085 | 8/1990 | Nakanishi et al. | 315/111.41 |
| 4,950,956 | 8/1990 | Asamaki et al. | 315/111.41 X |

Primary Examiner—Eugene R. LaRoche
Assistant Examiner—Do Hyun Yoo
Attorney, Agent, or Firm—Robert E. Bushnell

[57] ABSTRACT

The present invention provides a plasma generating method by using a modulation system in order to improve inner uniformity of plasma in plasma generating apparatus using the ECR plasma apparatus of another ECR system for performing an etching or deposition process. Unlike conventional fixed current systems, the embodiment disclosed transfers a high density ion portion to radiation form, thereby improving the uniformity of etching velocity or depositing velocity in wafers.

2 Claims, 7 Drawing Sheets

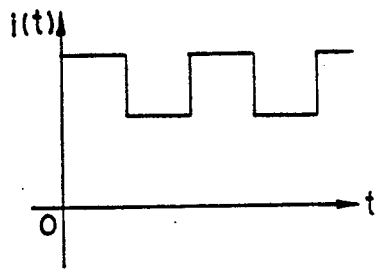
FIG. 5 a
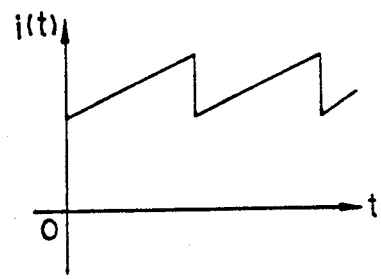
FIG. 5 b
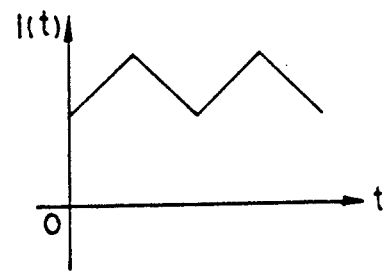
FIG 5. c
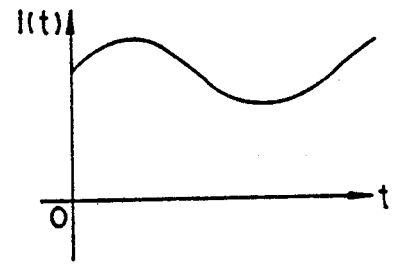
FIG 5. d

PLASMA GENERATING APPARATUS AND METHOD USING MODULATION SYSTEM

BACKGROUND OF THE INVENTION

1. Field of the Invention

This invention relates to in general to plasma generating apparatus and method using a modulation system, and in particular to a plasma generating apparatus and method that increases inner uniformity of plasma within an ECR plasma apparatus or another ECR system applying etching or depositing process.

2. Description of the Prior Art

One type of semiconductor apparatus for commerical purposes is generally used for etching or depositing on the surface of semiconductor substrate.

A semiconductor substrate conducting apparatus which forms high density plasma by a magnetic field rotation is improved in uniformity. Also, the prior plasma reaction apparatus using a waveguide, a rectangle/round transformer transforms microwave energy from rectangular mode to circular mode, and then a plasma conducting apparatus which is improved in the multiformity of plasma creating density. FIG. 1 shows a schematic sectional, view illustrating ECR (Electron Cyclotron Resonance) structure of an prior art. At first, when two of a motion frequency are resonated (for example, when the frequency is same), the motion energy is maximum. Also, the plasma generating efficiency comes to the maximum. Hence, one of the motion frequency is able to rotation motion by magnetic field generating in magnetic coil, the other is rotated the receiving force by the microwave. For example, when the microwave is the frequency of 2.45 GHz and the magnetic field by magnetic coil is 875 Gauss, the resonance is occurred. In relation to above mentioned terms, as the part occurring resonance is limited, ion density of center portion of plasma is high and the peripheral of its is low. Then, as the plasma of prior making the above method is achieved etching or depositing so that the plasma is arrived wafer get out of the discharge window. Therefore, etching velocity or depositing velocity difference between wafer center part and the peripheral is large so that it have the disadvantage of multiformity of plasma creating density.

SUMMARY OF THE INVENTION

This invention relates to plasma generating apparatus and method using modulation system.

It is an object of the invention to provide improved uniformity of an average etching velocity on the wafer in plasma generating apparatus using modulation system.

Another object is to provide a plasma generating apparatus comprising in combination: Magnetic coil, function generator, voltage combiner making modulated voltage wafeform to combine reference voltage and output voltage of modulating function generator to transform from fixed current to variable generator to transform from fixed current to variable current, current power supply varying the output voltage of voltage combiner with voltage.

Although the novel features which are characteristic of this invention are set forth more in detail in the claims appended hereto, the nature and scope of the invention may be better understood by referring to the following discription, taken in connection with the accompanying drawings forming a part thereof.

DETAILED DESCRIPTION

Figure 1:
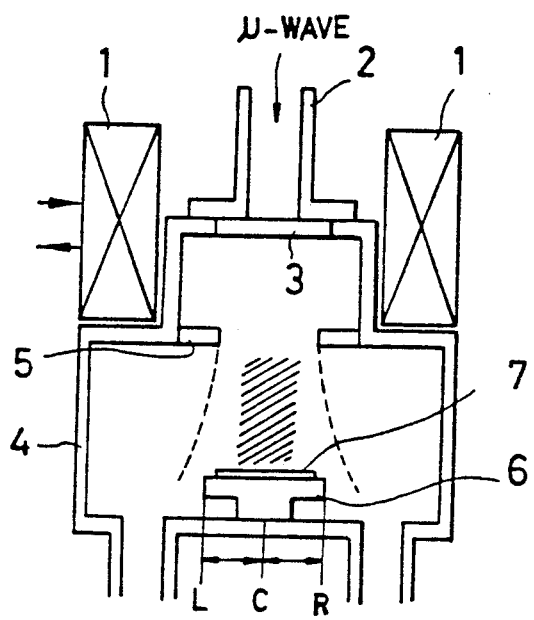
FIG. 1 is a structure view of plasma generating apparatus using Electron Cyclotron Resonance system of prior art.

Referring to the drawings, this invention is transformed the current suppling for magnetic field generating of prior art from fixed current to varied (modulated) current. And then, for the purpose of this above transform, this invention comprises voltage combiner making modulated voltage waveform to combine reference voltage and output voltage of modulating function generator. As it force to input the current power supply that is varied referring to voltage for transforming voltage of modulating function generator and reference voltage by using said voltage combiner, it makes the current i suppling the coil in the final from the modulating waveform. Also, this invention is used single coil system or complex coil system to the coil for generating magnetic field. If that complex coil system should use, the current $i_1$, $i_2$ would be controlled each other. If the phase of variable current should reverse, the effect of ion density mixing would be maximized.

Figure 2:
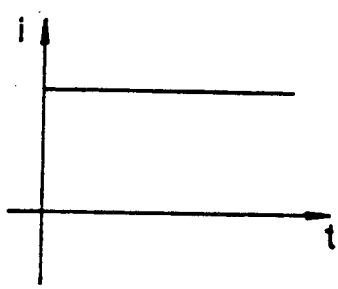
FIG. 2 is a view indicating the direct current which is in the form of the current flowing in magnetic coil of FIG. 1.
Figure 3:
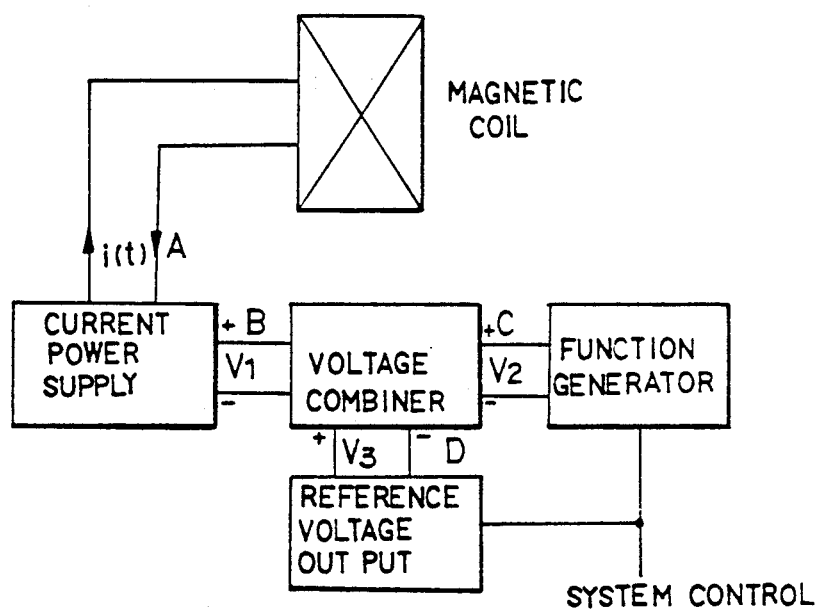
FIG. 3 is block diagram of magnetic coil current generating apparatus to attain object of this invention, FIG. 4a to FIG. 4d is a view showing voltage waveform generating in function generator, FIG. 5a FIG. 5d is a view showing a modulated current waveform generating in current generating apparatus of FIG. 3.
Figure 4:
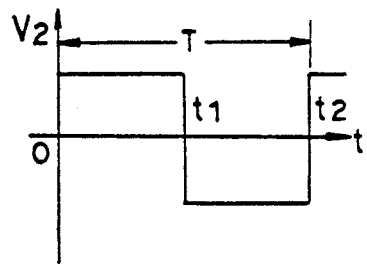
Figure 4:
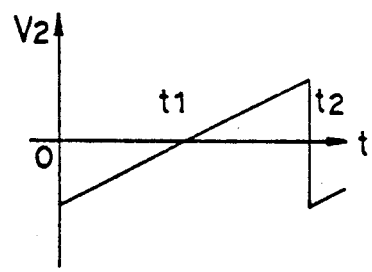
Figure 4:
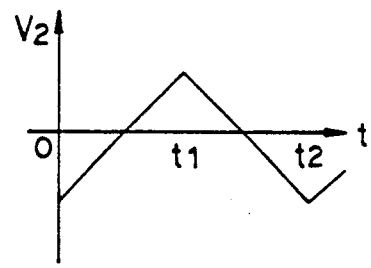
Figure 4:
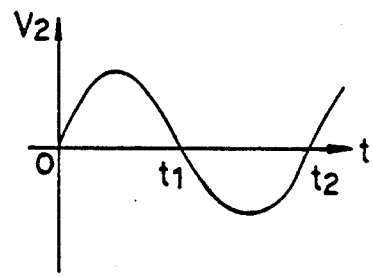

Referring to FIG. 2, ECR Apparatus of prior art is obtained the current of somewhat constant value with analog output signal of system at $V_1$ input port. Furthermore, as shown in FIG. 3, since the current power supply of this invention have a variable function of output current i by input voltage $V_1$ (in general the range is 0 to 10 V), it makes magnetic field supplying the current to magnetic coil.

Figure 6:
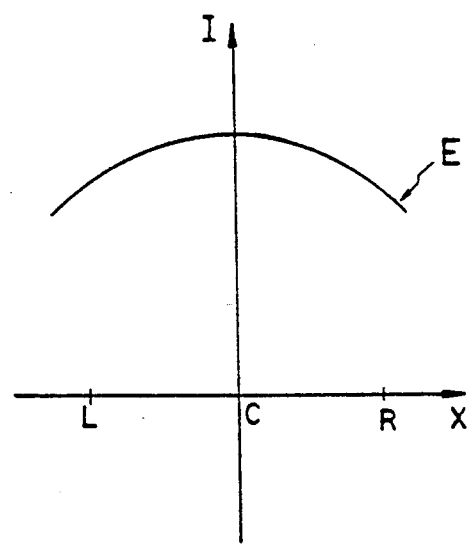
FIG. 6 is an ion density distribution view of the inner of plasma generating by ECR strcuture of prior art.

Generally, as the center part of plasma takes place resonance, the ion density distribution of plasma shows in FIG. 6. (For example, the center part is high and the peripheral part is low.)

This invention connects the output of voltage mixer to input port $V_1$ and as the said voltage mixer is mixed an output port $V_2$ of the general function generator with a standard voltage $V_3$ of the system, it is obtained a modulated current i(t) as shown in FIG. 5a to FIG. 5d. (For example, the voltage combiner is composed of the circuit comprizing several active element.) As shown in FIG. 4a to FIG. 4d, the 875 Gauss portion occurring resonance when the time is 0 to $t_1$, is shaped a doughnut. (The center portion is stronger than 875 Gauss.) As a result, it is obtained the same ion density distribution as shown in F of FIG. 7.

Figure 7:
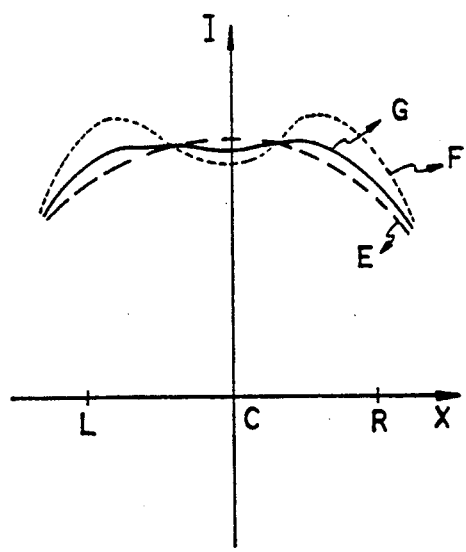
FIG. 7 is an improved view of ion density distribution of the inner of plasma generating by ECR structure using the modulating system of this invention.
Figure 8:
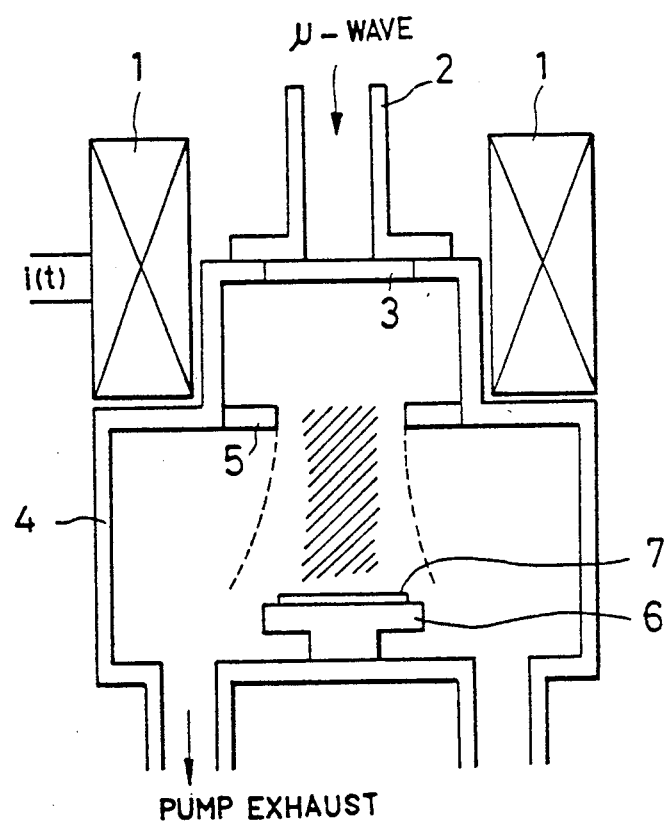
FIG. 8 is a strcuture in the case of one magnetic coil among the modulating system ECR apparatus of this invention.
Figure 9:
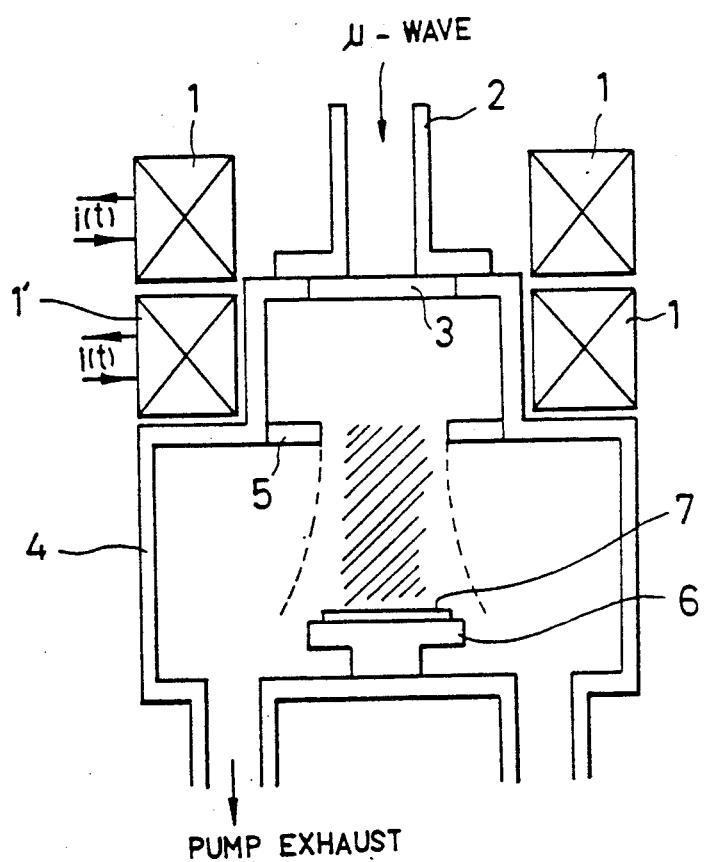
FIG. 9 is a structure in the case of two magnetic coil among the modulating system ECR apparatus of this invention.

Also, in the range of $t_1$ to $t_2$, as the center portion is closed 875 Gauss, the ion density of center portion is very high form (the E of FIG. 7). At this time, if the duty cycle and frequency T of $t_1$, $t_2$ are properly established, it appears ion density distribution of E and F of FIG. 7, then this setting, the uniformity of etching velocity in etching and the uniformity of depositing velocity in case of depositing process are improved.

In case of the above, the $t_1/t_2$ showing duty cycle is possible the range of 0.1 to 0.9 and the frequency T is usable the range of 1/10 to 10 Hz in case of considering the inductance of coil.

This invention has significant advantages.

As mentioned above, for the purpose of uniformity of plasma ion density distribution of plasma generating apparatus, as this invention is transferred high density ion portion occurring ECR resonance from radial form in using current modulation system, this invention improves the uniformity of etching velocity or depositing velocity in wafer comparing with the fixed current system of prior art.

While the invention has been shown in its forms, it should be apparent to those skilled in the art that is not so limited, but is susceptible to various changes without departing from scope of the invention.

I claim:

1. A method for modulating a plasma generating apparatus comprising:

modulating a voltage waveform of input electrical energy applied to a coil surrounding an electron cyclotron resonance plasma chamber to combine a reference voltage and an output voltage of a modulating function generator to transform said input electrical energy from fixed current to variable current; and varying the combined output voltage.

2. The method according to claim 1 wherein said modulating function generator has a duty cycle in the range of 0.1 to 0.9 and a frequency in the range of 1/10 to 10 Hz.

* * * * *